United States Patent
Shao et al.

(10) Patent No.: US 6,410,394 B1
(45) Date of Patent: Jun. 25, 2002

(54) METHOD FOR FORMING SELF-ALIGNED CHANNEL IMPLANTS USING A GATE POLY REVERSE MASK

(75) Inventors: Kai Shao; Yimin Wang; Jian Xun Li; Shao-Fu Sanford Chu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/465,305

(22) Filed: Dec. 17, 1999

(51) Int. Cl.[7] .............................. H01L 21/336
(52) U.S. Cl. ................ 438/289; 438/217; 438/231; 438/291; 438/303; 438/305
(58) Field of Search .................. 438/282, 289, 438/290, 291, 299, 301, 303, 305, 306, 307, 592, 594, 595, 199, 217, 231

(56) References Cited

U.S. PATENT DOCUMENTS

| | | | |
|---|---|---|---|
| 5,444,008 A | 8/1995 | Han et al. | 437/45 |
| 5,447,874 A | 9/1995 | Grivna et al. | 437/40 |
| 5,686,321 A | 11/1997 | Ko et al. | 437/29 |
| 5,688,700 A | 11/1997 | Kao et al. | 437/29 |
| 5,792,699 A | 8/1998 | Tsui | 438/290 |
| 5,856,225 A * | 1/1999 | Lee et al. | 438/291 |
| 5,915,181 A | 6/1999 | Tseng | 438/289 |
| 5,918,130 A | 6/1999 | Hause et al. | 438/290 |
| 5,981,383 A * | 11/1999 | Lur et al. | 438/655 |

OTHER PUBLICATIONS

Y. V. Ponomarev et al., "Channel Profile Engineering of Oil Micron Silicon MOSFET by Through-the-Gate Implantation".

A. Chatterjee et al., Sub-100nm Gate Length Metal Gate, NMOS Transistors Fabricated by Replacement Gate Process.

* cited by examiner

Primary Examiner—Chandra Chaudhari
Assistant Examiner—Jack Chen
(74) Attorney, Agent, or Firm—George O. Saile; Rosemary L. S. Pike

(57) ABSTRACT

A method for forming a CMOS transistor gate with a self-aligned channel implant. A semiconductor structure having a first active area is provided. A first insulating layer is formed on the semiconductor structure, and a second insulating layer is formed on the first insulating layer. The second insulating layer is patterned using a poly reverse mask and an etch selective to the first insulating layer to form a first channel implant opening, and the poly reverse mask is removed. A first channel implant mask is formed exposing the first channel implant opening. Impurity ions are implanted through the first channel implant opening to form a first threshold adjust region and a first anti-punchthrough region. A gate layer is formed over the semiconductor structure, and the first gate layer is planarized to form a gate electrode. The second insulating layer is removed, and lightly doped source and drain regions, sidewall spacers and source and drain regions can be formed adjacent the gate electrode.

8 Claims, 3 Drawing Sheets

METHOD FOR FORMING SELF-ALIGNED CHANNEL IMPLANTS USING A GATE POLY REVERSE MASK

BACKGROUND OF INVENTION

1) Field of the Invention

This invention relates generally to fabrication of a semiconductor device and more particularly to a method for forming the self-aligned channel profile for a CMOS device using a gate poly reverse mask.

2) Description of the Prior Art

The continued scaling of MOSFET gate lengths to submicron dimensions aggravates the problems of high gate resistance, polysilicon gate depletion and increased gate tunnel leakage. One method to overcome the problems of short channel effects is to use through-the-gate implantation. Channel implants are formed by implanting ions through the gate structure to form a doped region below the substrate surface in the gate area. Through-the-gate implantation can achieve the steep retrograde doping profiles, which can improve the short channel effects and increase current drivability. However, the implantation is difficult to control.

Another method used is the pocket implant. A localized ion implant is performed beneath the substrate surface in the gate area. This can be done using a photoresist mask. The pocket implant technology has greater reverse short channel effect because the LDD implant dose is increased to compensate for the channel dopant.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents and articles.

U.S. Pat. No. 5,444,008 (Han et al.) shows a high-performance punchthrough implant method for MOS/VLSI using an image reversal photo lithography method. In this invention the positive photoresist layer is formed on the substrate and patterned by means of image reversal photo lithography to form an appature. P-type ions are implanted through the appature to form an anti-punchthrough implant below the subsequently formed gate.

U.S. Pat. No. 5,686,321 (Ko et al.) shows a method for forming a self-aligned punchthrough stop region using a blanket implant, forming an implant mask with a gate opening, forming spacers at the edge of the opening, performing a punchthrough implant, removing the implant mask, and forming source and drain regions.

U.S. Pat. No. 5,915,181 (Tseng) show a process for fabricating a deep submicron MOSFET device using a self-aligned threshold voltage adjust region.

U.S. Pat. No. 5,918,130 (Hause et al.) shows a method for preforming source and drain implants and forming silicide contacts prior to anti-punchthrough implant and gate formation.

U.S. Pat. No. 5,688,700 (Kao et al.) and U.S. Pat. No. 5,447,874 (Grivna et al.) show methods for forming a field effect transistor using a self aligned doped implant region under the channel.

U.S. Pat. No. 5,792,699 (Tsui) shows a method for reduction of reverse short channel effect in MOSFET using a channel ion implant through the gate after the source and drain are formed and its damage annealed out.

Channel Profile Engineering of 0.1 Micron Silicon MOSFET by Through-the-Gate Implantation by Y. V. Ponomarev et al. teaches that the short channel effects can be improved by the use of super-steep retrograde (SSR) doping profiles. This SSR channel profile is preferably achieved for NMOST's by through-the-gate implantation.

Sub-1000 nm Gate Lenth Metal Gate NMOS Transistors Fabricated by Replacement Gate Process by A. Chatterjee et al. teaches a process of fabricating a NMOS transistor using self-aligned source and drain using a replacement gate process to prevent high tempature processing of gate materials during source and drain anneal.

SUMMARY OF THE INVENTION

It is an object of the present invention to provide a method for forming a channel implant using a gate poly reverse mask.

It is another object of the present invention to provide a method for forming a channel implant with a lower threshhold voltage roll-off than a through the gate implant and without reverse short channel effects like a pocket implant.

To accomplish the above objectives, the present invention provides a method for forming a CMOS transistor gate with a self-aligned channel implant. A semiconductor structure having a first active area is provided. A first insulating layer is formed on the semiconductor structure, and a second insulating layer is formed on the first insulating layer. The second insulating layer is patterned using a poly reverse mask and an etch selective to the first insulating layer to form a first channel implant opening, and the poly reverse mask is removed. A first channel implant mask is formed exposing the first channel implant opening. Impurity ions are implanted through the first channel implant opening to form a threshhold voltage adjust region and an anti-punchthrough region. A gate layer is formed over the semiconductor structure, and the gate layer is planarized to form a first gate electrode. The second insulating layer is removed, and lightly doped source and drain regions, sidewall spacers and source and drain regions can be formed adjacent the gate electrode.

The present invention provides considerable improvement over the prior art. Most importantly, the present invention provides a channel implant which can provide a lower threshhold voltage roll-off than a through the gate implant, without a reverse short channel effect as in a pocket implant. Also, the present invention can use existing photolithography reticles to form reverse gate poly masks.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming CMOS gates with self-aligned channel implants.

Figure 1A:
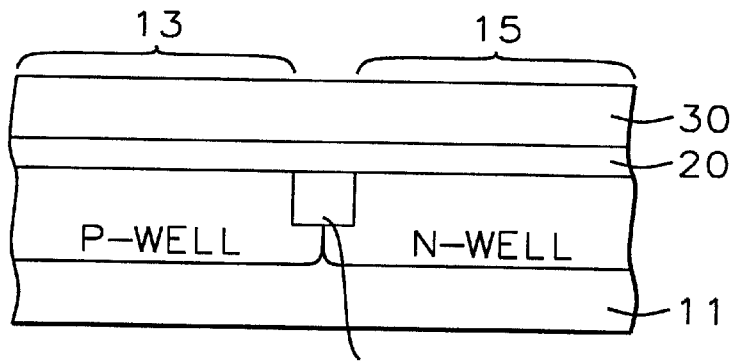
FIGS. 1A, 1B, 2A, 2B, 3 & 4 illustrate sequential sectional views of a process for forming a self-aligned channel implant using a gate poly reverse mask according to the invention.

Referring to FIG. 1A, the process begins by providing a semiconductor structure (substrate) (11) having a first active area (13) and possibly having a second active area (15). The first active area (13) and the second active area (15) are defined and separated by isolation regions (12). The semiconductor substrate is understood to possibly include a wafer of semiconductor material such as monocrystalline silicon or germainium or a similar structure as is known in the art such as a silicon-on-insulator (SOI) structure. The isolation structure (12) can be any isolation structure know in the art, such as a shallow trench isolation (STI) or localized oxidation of silicon (LOCOS).

For illustrative purposes a NMOS gate will be formed in the first area (13) and a PMOS gate will be formed in the second area (15). It should be understood by those skilled in the art that NMOS and PMOS gates can be formed in any order in a CMOS process. A P-well can be formed in the first active area (13) and a N-well can be formed in the second active area (15) of the semiconductor substrate The P-well is preferably doped with B ions at a concentration of between about $1E17$ atm/cm$^3$ and $8E17$ atm/cm$^3$. The N-well is preferably doped with P ions at a concentration of between about $1E17$ atm/cm$^3$ and $5E17$ atm/cm$^3$.

Still refering to FIG. 1A, a first insulating layer (20) is formed on the semiconductor structure (11). The first insulating layer (20) is preferably composed of silicon dioxide having a thickness of between about 50 Angstroms and 400 Angstroms.

Still refering to FIG. 1A, a second insulating layer (30) is formed on the first insulating layer (20). The second insulating layer (30) is preferably composed of silicon nitride having a thickness of between about 2000 Angstroms and 4000 Angstroms. The second insulating layer preferably has an etch selectivity to the first insulating layer (20 of greater than 2:1 using a plasma dry etch.

Figure 1B:
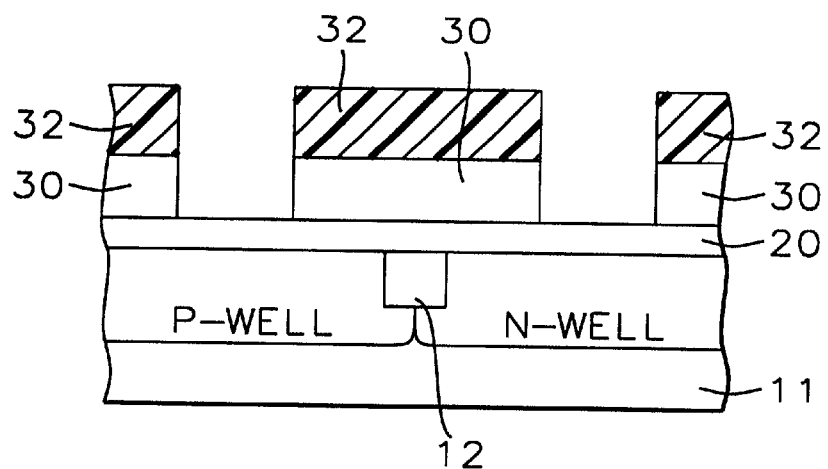

Referring to FIG. 1B, the second insulating layer (30) is patterned to form a first channel implant opening (35) for an NMOS gate and a second channel implant opening (37) for a PMOS gate, using a poly reverse mask (32). The poly reverse mask can be formed by using the lithography image for patterning the poly layer (gate electrodes) and using the reverse type (eg positive or negative) of resist. Alternatively, a reverse image of the poly layer (e.g. gate electrode) patterning image can be formed and used. Interconnection poly openings (not shown) can also be formed at this time. The channel implant openings (35,37) are formed using an etch which has a high selectivity of the second insulating layer (30) to the first insulating layer (20. For example, a second insulating layer comprising silicon nitride can be etched selectively to a first insulating layer comprising silicon dioxide using a reactive ion etch with $CHF_3/O_2$, $CH_2F_2$, or $CH_3F$. The etch preferably has a selectivity to the first insulating layer of between about 2:1 and 10:1. The first insulating layer is not significantly etched during the second insulating layer etch, and has a thickness of at least 20 Angstroms following the patterning of the second insulating layer. Following patterning of the second insulating layer (30), the poly reverse mask (32) is removed. An advantage of the present invention is that it can utilize existing patterns for gate formation.

Figure 2A:
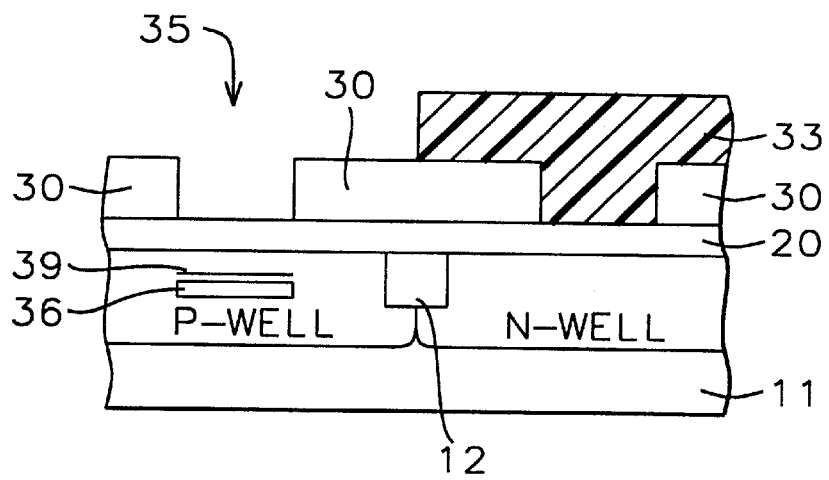

Referring to FIG. 2A, a first channel implant mask (33) is formed over the second insulating layer (30), covering the second channel implant opening (37), and leaving the first channel implant opening (35) exposed. The first channel implant mask can be formed using a photolithography process and the lithography image for the P-well implant. Two implant steps are performed through the exposed first channel implant opening (35). The first implant step forms a first threshold voltage adjust region (39) and the second implant step forms a first anti-punchthrough region (36).

The first threshold voltage adjust region (39) is formed by implanting $BF_2$ ions through the first implant opening at an energy of between about 40 KeV and 50 KeV, and at a dose of between about $2E12$ atm/cm$^2$ and $6E12$ atm/cm$^2$. The resulting first threshold voltage adjust region (39) has a concentration of B ions of between about $5E17$ atm/cm$^3$ and $4E18$ atm/cm$^3$ and a depth of between about 100 Angstroms and 200 Angstroms.

The First anti-punchthrough region (36) is formed by implanting B ions through the first channel implant opening (35) at an energy of between about 85 KeV and 95 KeV and at a dose of between about $1E13$ atm/cm$^2$ and $4E13$ atm/cm$^2$. The resulting first anti-punchthrough region (36) has a concentration of B ions of between about $1E18$ atm/cm$^3$ and $5E18$ atm/cm$^3$ and a depth of between about 1000 Angstroms and 1500 Angstroms.

Figure 2B:
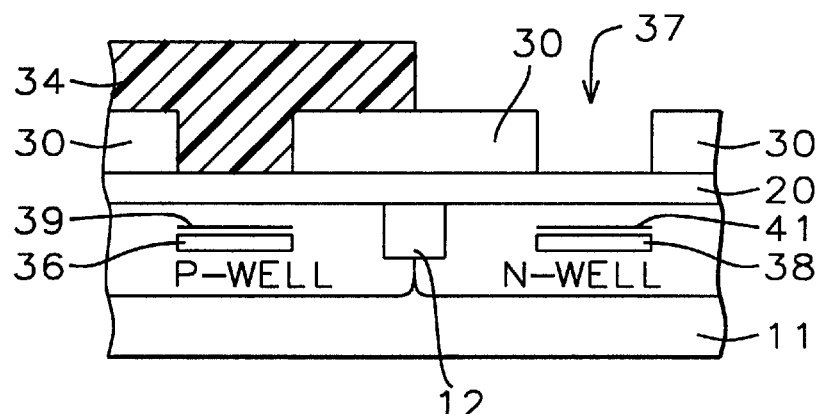

Referring to FIG. 2B, the first channel implant mask (33) is removed, and a second channel implant mask (34) is formed covering the first channel implant opening (35), and leaving the second channel implant opening (37) exposed. The second channel implant mask can be formed using a photolithography process and the lithography image for the N-well implant. Two implant steps are performed through the exposed second channel implant opening (35). The first implant step forms a second threshold voltage adjust region (41) and the second implant step forms a seond anti-punchthrough region (38).

The second threshold voltage adjust region (41) is formed by implanting P ions through the second implant opening (37) at an energy of between about 40 KeV and 50 KeV, and at a dose of between about $3E12$ atm/cm$^2$ and $5E12$ atm/cm$^2$. The resulting second threshold voltage adjust region (41) preferably has a concentration of P ions of between about $6E17$ atm/cm$^3$ and $5E18$ atm/cm$^3$ and a depth of between about 100 Angstroms and 200 Angstroms.

The Second anti-punchthrough region (38) is formed by implanting P ions through the second channel implant opening (37), preferably at an energy of between about 100 KeV and 140 KeV and at a dose of between about $3E12$ atm/cm$^2$ and $5E12$ atm/cm$^2$. The resulting second anti-punchthrough region (38) preferably has a concentration of P ions of between about $1E18$ atm/cm$^3$ and $3E18$ atm/cm$^3$ and a depth of between about 1000 Angstroms and 2000 Angstroms.

Figure 3:
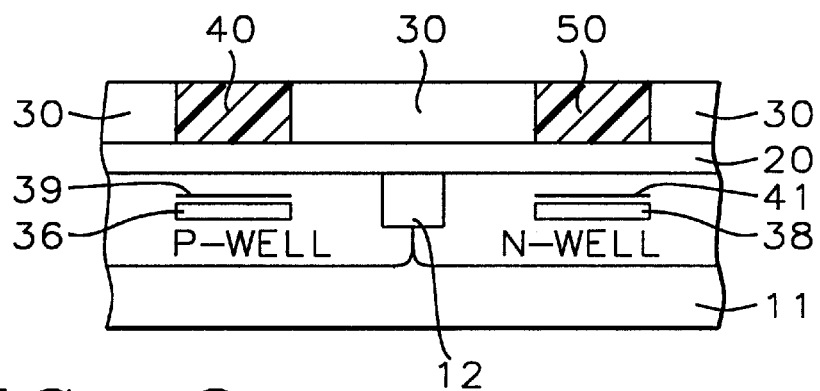

Refering to FIG. 3, a gate layer is formed over the first area (13) and the second area (15) of the semiconductor substrate (11). The gate layer is composed of a conductive material such as doped polysilicon, tungsten, or polysilicon with an overlying layer of tungsten silicide. The gate layer has a sufficient thickness to completely fill the first channel implant opening (35) and the second channel implant opening (37). The gate layer is planarized to form a first gate electrode (40) in the first area (13) and a second gate electrode (50) in the second area using a CMP process stopping on the second insulating layer (30).

Figure 4:
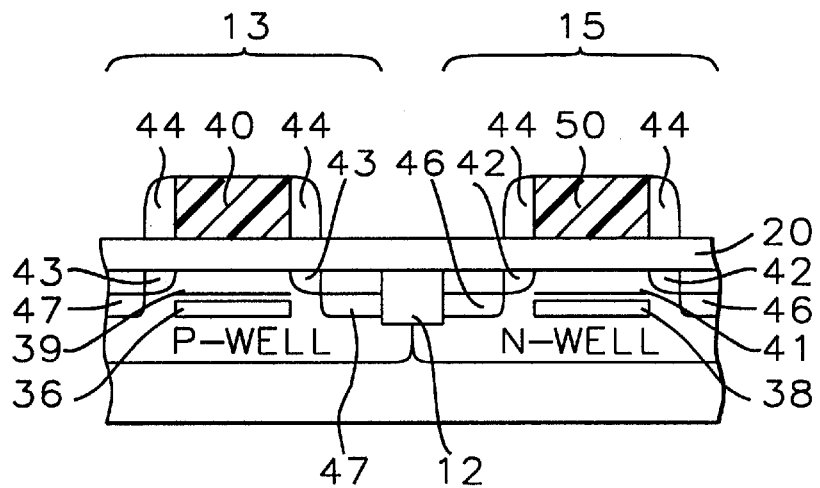

Refering to FIG. 4, the second insulating layer (30) is removed, preferably using an etch selective to the first insulating layer (20 and the first and second gate electrodes (40,50). For example, a second insulating layer composed of silicon nitride can be removed selectively to a first insulating layer composed of silicon dioxide and first and second gate electrodes (40,50) composed of polysilicon using a reactive ion etch with a $CHF_3/O_2$, $CH_2F_2$, or $CH_3F$ chemistry.

Still referring to FIG. 4, the CMOS process can be completed by forming source and drain structures, as is known in the art. For example, the first area (13) can be covered with a PLDD photoresist mask, and P-type lightly doped source and drain regions (42) can be formed adjacent to that second gate electrode (50) by implanting P-type ions into the surface of the semiconductor structure (11) using the second gate electrode (50) as an implant mask. The P-type lightly doped source and drain regions are preferably formed by implanting $BF_2$ ions into the surface of the semiconductor structure (11) at a dose of between about 1E13 atm/cm$^2$ and 2E14 atm/cm$^2$ and an energy of between about 10 KeV and 30 KeV. Following ion implantation, the PLDD photomask is removed.

N-type source and drain regions (43) can be formed by covering the second area (15) with an NLDD photomask, and implanting N-type ions into the surface of the semiconductor structure (11) using the first gate electrode (40) as an implant mask. The N-type lightly doped source and drain regions (43) are preferably formed by implanting P ions into the surface of the semiconductor structure (11) at a dose of between about 1E13 atm/cm$^2$ and 2E14 atm/cm$^2$ and an energy of between about 20 KeV and 40 KeV. Following ion implantation, the NLDD photomask is removed.

Spacers (44) can be formed by depositing a dielectric layer such as silicon dioxide or silicon nitride over the first area (13) and the second area (15) and anisotropically etching.

P-type source and drain regions (46) and N-type lightly doped source and drain regions (47) can be formed adjacent to the sidewall spacers (44) similarly to the P-type lightly doped source and drain region (42) and the N-type lightly doped source and drain region (43). The first area (13) is covered with a P+ mask and P-type ions are implanted into the surface of the semiconductor structure (11) to form P-type source and drain regions (46), using the second gate electrode (50) and its spacers (44) as an implant mask, and the P+ mask is removed. The second area (15) is covered with an N+ mask, and N-type ions are implanted into the surface of the semiconductor structure (11) to form N-type source and drain regions (47) using the first gate electrode (40) and its spacers as an implant mask, and the N+ mask is removed. P-type source and drain regions are preferably formed by implanting $BF_2$ ions into the surface of the semiconductor structure (11) at a dose of between about 2E15 atm/cm$^2$ and 5E15 atm/cm$^2$ and an energy of between about 20 KeV and 40 KeV, using the second gate electrode (50) and the sidewall spacers (44) as an implant mask. N-type source and drain regions are preferably formed by implanting As ions into the surface of the semiconductor structure (11) at a dose of between about 2E15 atm/cm$^2$ and 5E15 atm/cm$^2$ and an energy of between about 40 KeV and 60 KeV using the first gate electrode (40) and the sidewall spacers (44) as an implant mask.

Figure 5:
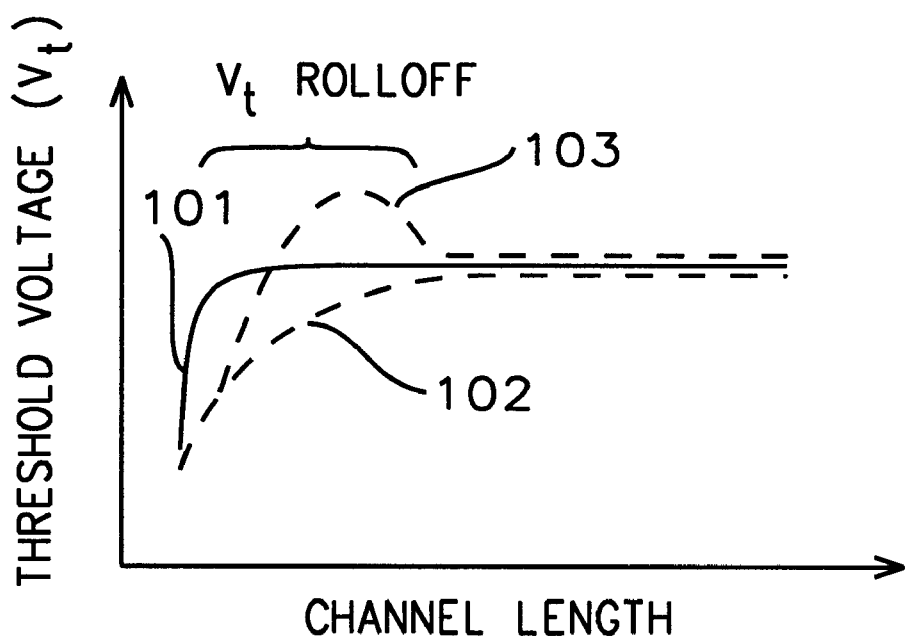
FIG. 5 illustrates the threshhold voltage curves plotted against the channel length for a transistor using the process of the invention, a transistor formed using a through-the-gate implant, and a transistor using a pocket implant.

Referring to FIG. 5, the key advantages of the present invention are that a transistor formed using the present invention (101) will have a slower threshhold voltage rolloff(eg the threshhold voltage does not drop as quickly when the channel length is reduced) than a through-the-gate implant transistor (102), without the reverse short channel effects (eg the threshhold voltage increases as the channel length deceases) of a pocket implant transistor (103).

While the invention has been particularly shown and described with reference the preferred embodiments thereof, it will be understood by those skilled in the art that various changes in form and details may be made without departing from the spirit and scope of the invention.

What is claimed is:

1. A method for forming a transistor gate with a self-aligned channel implant, comprising the sequential steps of:

a. providing a semiconductor structure having a first active area;

b. forming a first insulating layer on said semiconductor structure, and forming a second insulating layer on said first insulating layer;

c. patterning said second insulating layer using a poly reverse mask and an etch selective to said first insulating layer to form a first channel implant opening over said first active area;

d. removing said poly reverse mask, and forming a first channel implant mask on a second active area, whereby said first channel implant opening is exposed;

e. implanting impurity ions through said first channel implant opening to form a first threshold voltage adjust region and implanting impurity ions through said first channel implant opening to form a first anti-punchthrough region;

f. depositing a gate layer over said semiconductor structure and said second insulating layer, and planarizing said gate layer using a chemical mechanical planarization process to form a first gate electrode; and g. removing said second insulating layer, thereby exposing sidewalls of the first gate electrode.

2. The method of claim 1 wherein said first insulating layer comprises silicon dioxide having a thickness of between about 50 Angstroms and 400 Angstroms and said second insulating layer comprises silicon nitride having a thickness of between about 2000 Angstroms and 4000 Angstroms.

3. The method of claim 2 wherein said second insulating layer is patterned using a poly reverse mask and an etch with a selectivity to the first insulating layer of greater than 2:1.

4. The method of claim 1 wherein said first threshold voltage adjust region is formed by implanting $BF_2$ ions at an energy of between about 40 KeV and 50 KeV and a dose of between about 2E12 atm/cm$^2$ and 6E12 atm/cm$^2$, and said first anti-punchthrough region is formed by implanting B ions at an energy of between about 85 KeV and 95 KeV and a dose of between about 1E13 atm/cm$^2$ and 4E13 atm/cm$^2$.

5. The method of claim 1 wherein said first threshold voltage adjust region is formed by implanting P ions at an energy of between about 40 KeV and 50 KeV and a dose of between about 3E12 atm/cm$^2$ and 5E12 atm/cm$^2$, and said first anti-punchthrough region is formed by implanting P ions at an energy of between about 100 KeV and 140 KeV and a dose of between about 3E12 atm/cm$^2$ and 5E12 atm/cm$^2$.

6. The method of claim 1 wherein said gate layer comprises polysilicon.

7. The method of claim 1 wherein said gate layer comprises tungsten.

8. The method of claim 1 which further includes forming lightly doped source and drain regions adjacent said first gate electrode, forming spacers on the sidewalls of said first gate electrode, and forming source and drain regions adjacent said spacers.

\* \* \* \* \*